United States Patent [19]

Schwartzbach

[11] Patent Number: 5,025,231
[45] Date of Patent: Jun. 18, 1991

[54] TEMPERATURE-CONTROLLED CRYSTAL OSCILLATOR CIRCUIT

[75] Inventor: Bjarne Schwartzbach, Cambridge, England

[73] Assignee: U.S. Philips Corp., New York, N.Y.

[21] Appl. No.: 529,044

[22] Filed: May 25, 1990

[30] Foreign Application Priority Data

Jun. 9, 1989 [GB] United Kingdom ............... 8913322

[51] Int. Cl.$^5$ .......................... H03B 5/36; H03L 1/02
[52] U.S. Cl. ................................ 331/116 R; 331/176
[58] Field of Search .................. 331/66, 116 R, 158, 331/176

[56] References Cited

U.S. PATENT DOCUMENTS 3,821,665  6/1974  Irwin et al. ................. 331/176 X

FOREIGN PATENT DOCUMENTS 1163064  9/1969  United Kingdom .

Primary Examiner—Siegfried H. Grimm
Attorney, Agent, or Firm—Steven R. Biren

[57] ABSTRACT

A temperature controlled crystal oscillator circuit comprising an amplifier (12) having a feedback path including a crystal (26) and a frequency pulling element (28), and a temperature compensating voltage generating circuit (30) coupled to the frequency pulling element (28). The voltage generating circuit (30) produces a voltage, $V_{comp}$, generated in accordance with the following function:

$$V_{comp} = b^* \exp[a1(T-T_R)] + b^* \exp[-a2^*(T-T_R)] + c^*(T-T_R)$$

where
$T_R$ is a reference temperature in degrees Kelvin
$T$ is the working temperature in degrees Kelvin
a1, a2, b and c are constants.

14 Claims, 3 Drawing Sheets

TEMPERATURE-CONTROLLED CRYSTAL OSCILLATOR CIRCUIT

BACKGROUND OF THE INVENTION

The present invention relates to a temperature-controlled crystal oscillator circuit having particular, but not exclusive application, in master oscillator and/or local oscillator circuits in transportable radio communications equipments, for example mobile and portable transceivers and paging receivers.

With the advent of narrow radio channels in recent years, there is a need for stable oscillator circuits particularly in transportable equipments which may have to operate over a typical temperature range of $-30$ degrees C. to $+70$ degrees C. Crystals, particularly AT-cut quartz crystals, are used as a frequency stabilizing element. However it is well known that AT-cut quartz crystals drift in response to temperature changes. One method of countering the problem of drift is to place the crystal in a temperature-controlled oven. However such ovens consume power, which is undesirable for battery-powered transportable equipment.

Another method is to generate a correction voltage which is applies to a frequency pulling element, such as a varicap diode, in an oscillator circuit.

In one example of the method in which a correction or compensating voltage is produced, disclosed in SU 1136299A, compensating signal zones are formed on an oscillator temperature-frequency characteristic of say an oscillator having as AT-cut crystal. These zones lie on either side of the point of inflection lying on the abscissa, which point is referenced $t_2$ in the single figure of SU 1136299A. The first of the zones lies between the maximum in the characteristic which occurs at a temperature $t_1$ (which is less than $t_2$) and the second zone lies between $t_2$ and the minimum in the characteristic which occurs at a temperature $t_1$ (which is less than $t_2$ and the second zone lies signal for each zone, that is zones $(t_2-t_1)$ and $(t_3-t_2)$ comprises a signal which varies in accordance with an exponential function. The start and end of the compensating signal waveform for the first zone is determined by the maximum point and the point of inflection and for the second zone by the point of inflection and the minimum point. Once the characteristic has been generated, it is shifted so that at a particular temperature, the maximum point corresponds to the rated frequency. SU 1136299A does not illustrate a circuit by which this method is implemented.

A voltage generating circuit for producing a correction voltage is disclosed in European Patent Specification 0129618. This known circuit comprises a temperature sensor whose output is connected to a drive frequency pulling control element via a power series function generator and a summing amplifier. The temperature sensor is adapted to provide an electrical output $f(t)$ that is a linear varying function of temperature. The summing amplifier is adapted to provide a weighted sum of the power series function generator outputs, which sum is applied to the control element. The power series function generator is adapted to generate a series of Chebyshev-like outputs of which the nth output is a polynomial function in $f(t)$ of order $(n-1)$. The summing amplifier sums four or more different outputs of the power series function generator. The power series may be derived using the Weierstrass theorem in which:

$$V(T) = A_0 + A_1(T-T_0) + A_2(T-T_0)^2 + A_3(T-T_0)^3 + \ldots A_n(T-T_0)^n$$

where
$V(T)$ is the required compensating voltage
$T$ is the working temperature
$T_0$ is the inflection temperature, and
$A_0, A_1, A_2$ etc. are the summing coefficients.

Also known is U.S. Pat. No. 3,821,665 which discloses a circuit for producing a correction voltage in accordance with a power series comprising three or more terms.

Although basing temperature compensation on generating a power series function will give acceptable results there is always room to make improvements.

SUMMARY OF THE INVENTION

According to one aspect of the present invention there is provided a method of temperature controlling a crystal oscillator circuit including a crystal and a frequency pulling element, the method comprising generating a compensating voltage in accordance with a function formed by a linear term, an exponential term and an inverse exponential term, and applying the compensating voltage to the frequency pulling element.

According to another aspect of the present invention there is provided a temperature controlled crystal oscillator circuit comprising an amplifying element having a feedback path including a crystal and a frequency pulling element, and temperature compensating voltage generating means coupled to the frequency pulling element, said compensating voltage generating means applying a voltage in accordance with a function formed by a linear term, an exponential term and an inverse exponential term.

The present invention is based on the realization that exponential terms are asymmetrical, so that by suitably combining a linear term, an exponential term and an inverse exponential term it is possible to generate the desired characteristic for compensating for the effects of temperature shift on the stability of a crystal. Additionally the asymmetry of the exponential and inverse exponential function can be used to advantage when the desired characteristic is not itself symmetrical because the positive and negative parts of the characteristic can be altered independently of one another by varying the multiplying coefficients. Such an advantage cannot be obtained easily when using a power series function because they are symmetrical about the ordinate and therefore a change will affect both the positive and negative parts of the characteristic.

In an embodiment of the present invention the function is $$V_{comp} = b^* \exp[a1^*(T-T_R)] - b^* \exp[-a2^*(T-T_R)] - c^*(T-T_R)$$

where
$V_{comp}$ is the compensating voltage,
$T_R$ is a reference temperature in degrees Kelvin,
$T$ is the working temperature in degrees Kelvin, and
a1, a2, b and c are constants.

The means for producing the exponential and inverse exponential terms may include respective exponential amplifiers and if desired the compensating voltage generating means may further comprise means for compensating for the temperature effects in the exponential amplifiers.

According to a further aspect of the present invention there is provided a radio communications apparatus including the temperature-controlled crystal oscillator circuit in accordance with said another aspect of the present invention.

BRIEF DESCRIPTION OF THE DRAWINGS

The present invention will now be described, by way of example, with reference to the accompanying drawings, wherein.

In the drawings the same reference numerals have been used to illustrate corresponding features.

DESCRIPTION OF THE PREFERRED EMBODIMENTS

Figure 1:
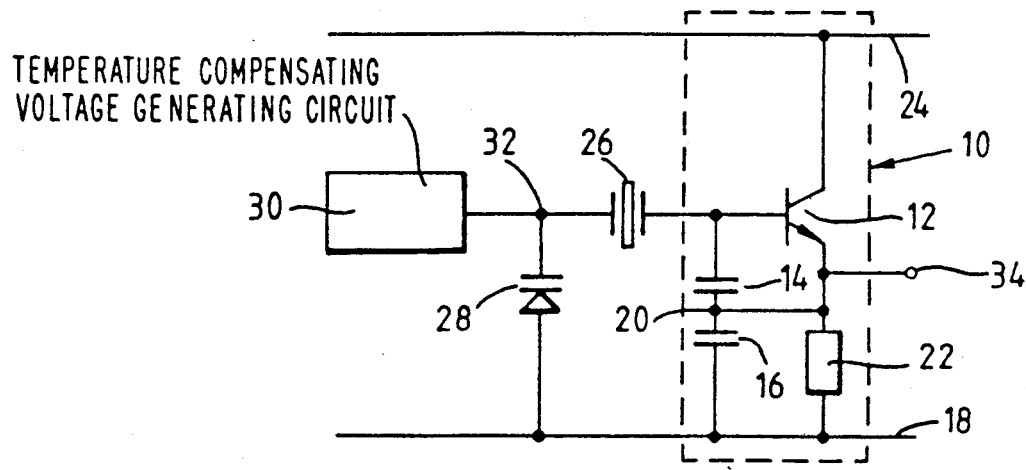
FIG. 1 is a schematic diagram of a temperature-controlled crystal oscillator made in accordance with the present invention.

FIG. 1 illustrates a Colpitt's oscillator 10 comprising a NPN transistor 12 having first and second capacitors 14, 16 connected between the base electrode and a supply line 18. A junction 20 of the series connected capacitors 14, 16 is connected to the emitter electrode of the transistor 12. A resistor 22 is connected between the emitter electrode and the supply line 18. The collector electrode is connected to another supply line 24. An AT-cut crystal 26 and a varactor diode 28 are connected in series between the base electrode of the transistor 12 and the supply line 18. A temperature compensating voltage generating circuit 30 is connected to a junction 32 between the crystal 26 and the varicap diode 28. An oscillator output 34 is connected to the emitter electrode of the transistor 12.

Figure 2:
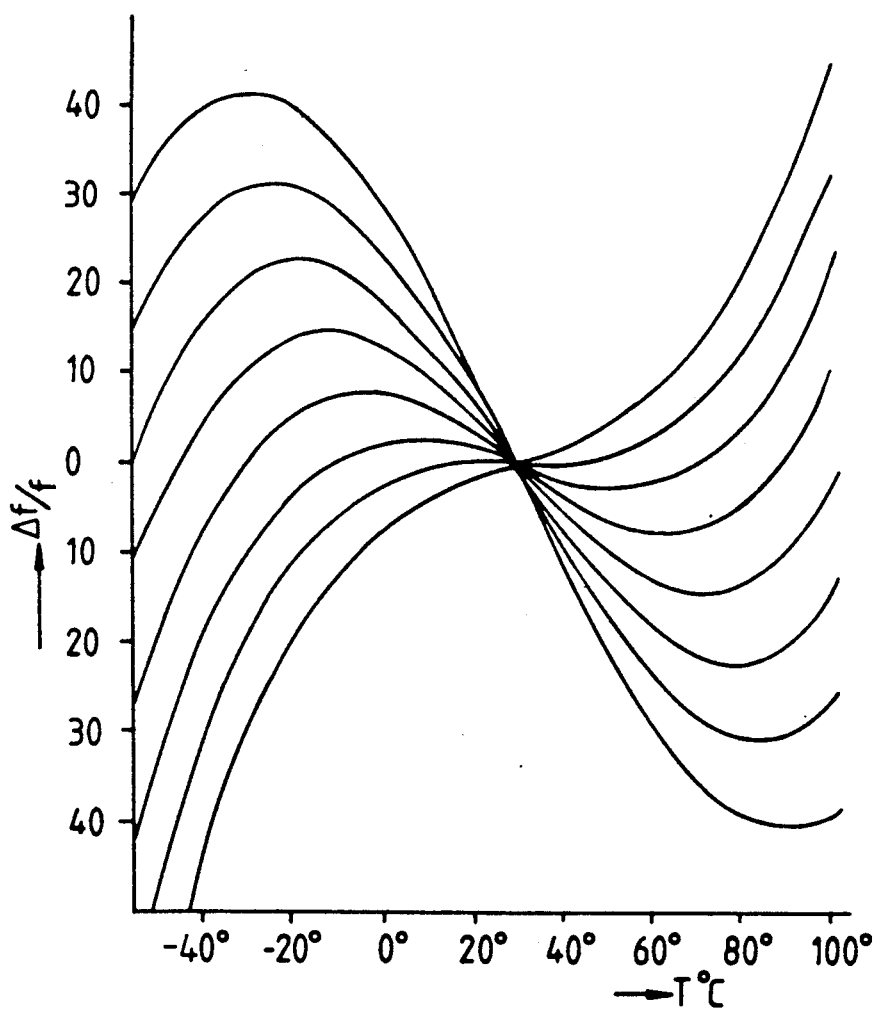
FIG. 2 is a graph showing temperature drift characteristics of an AT-cut crystal.

The operation of this type of oscillator is generally well known and therefore will not be described in detail. The frequency of the oscillator is stabilized by the crystal 26. However the frequency of the crystal 26 can be pulled to a limited extent by varying the capacitance of the varicap diode 28. FIG. 2 shows a number of curves of the drift, $\Delta f/f$, in the frequency of the crystal, expressed in parts per million, with temperature, T, in degrees Celsius. In order to be able to compensate for such drift then it is necessary to vary the capacitance of the varicap diode 28 so that the crystal frequency is pulled in an opposite manner to drift. The voltage required to vary the capacitance of the varicap diode 28 is generated by the circuit 30.

Figure 3:
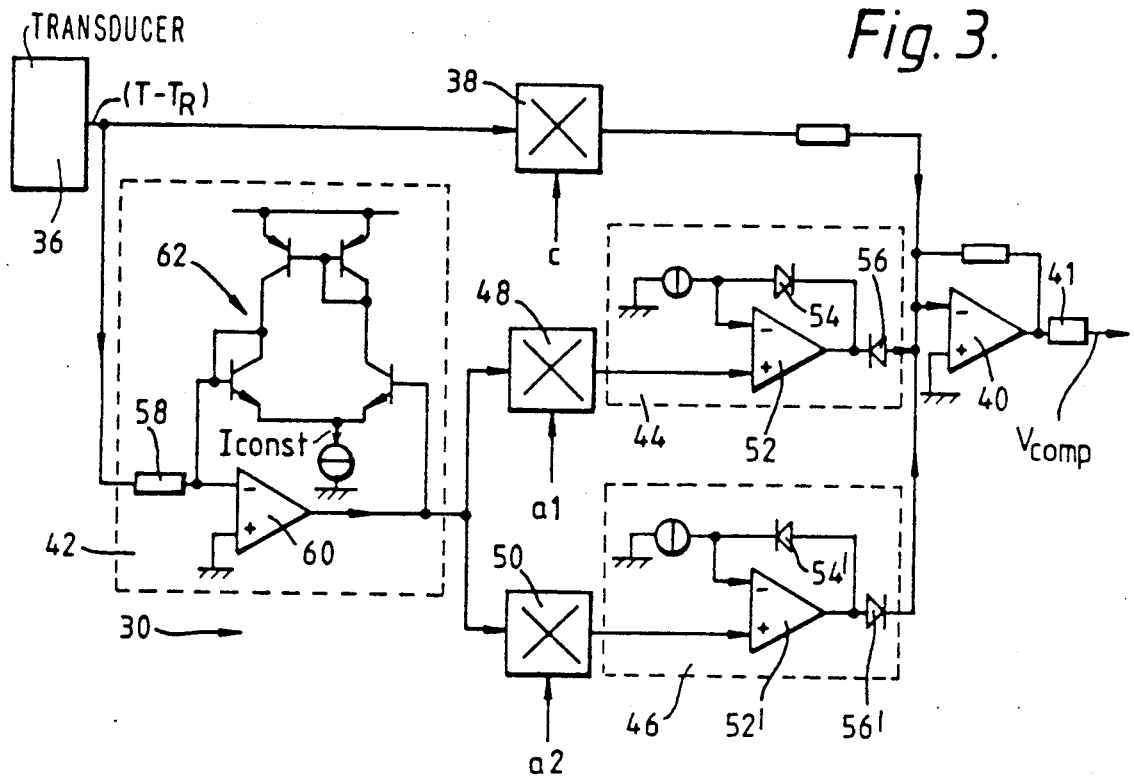
FIG. 3 is a circuit diagram, partly in block schematic form, of an embodiment of a temperature compensating voltage generating circuit.

The circuit 30 which is shown in greater detail in FIG. 3 generates a compensating voltage $V_{comp}$ in accordance with the function $$V_{comp} = b^* \exp[a1^*(T-T_R)] - b^* \exp[-a2^*(T-T_R)] - c^*(T-T_R)$$

where $T_R$ represents the temperature in degrees K. at the point of inflection of the curves shown in FIG. 2, that is approximately 30 degrees C. or 303 degrees K., $(T-T_R)$ represents the temperature difference in degrees Kelvin between the working temperature T and $T_R$, and a1, a2, b and c are constants although a1 and a2 are adjustable.

Figure 4:
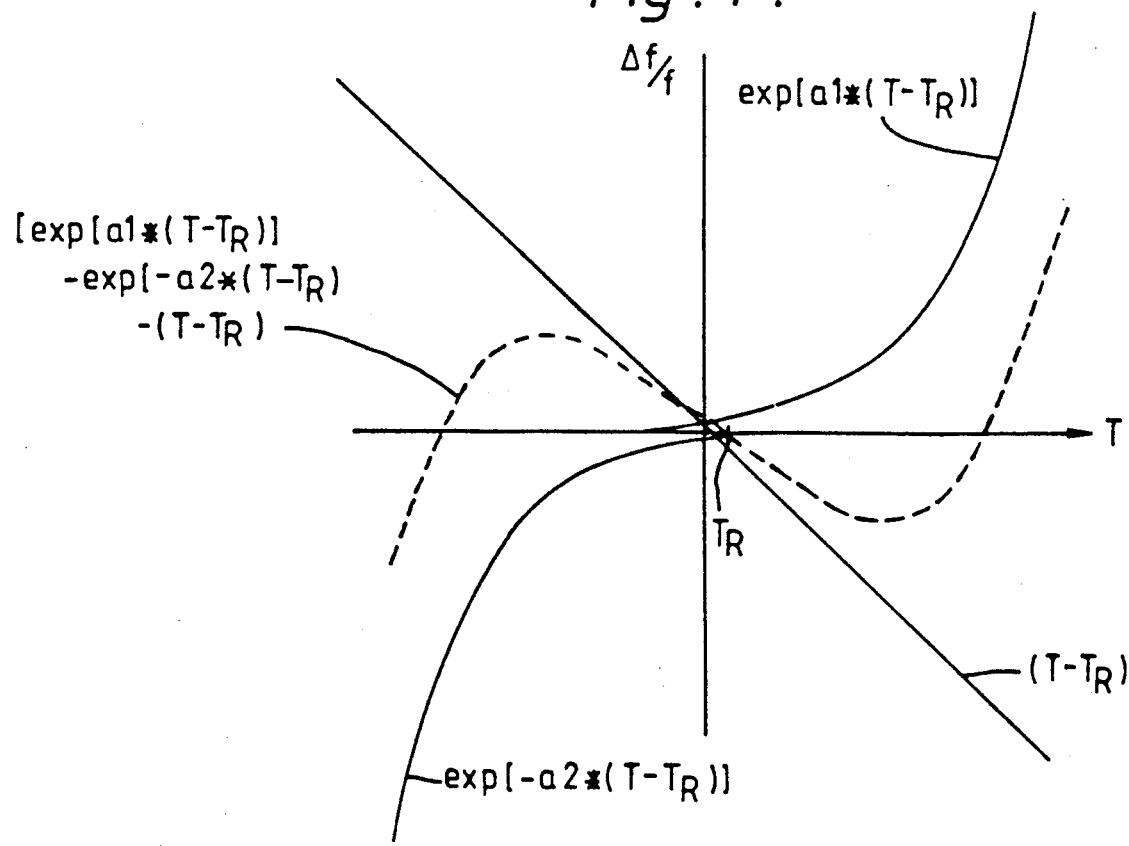
FIG. 4 is a graph illustrating an example of the linear, exponential and inverse exponential terms which are combined to form the temperature compensating characteristic shown in broken lines.

Examples of linear, exponential and inverse exponential curves used to derive $V_{comp}$, shown in broken lines, are shown in FIG. 4. The exponential and inverse exponential curves are asymmetrical with respect to the ordinate and by adjusting the individual value of the constants a1, a2 it is possible to vary the shape of one curve relative to the other and thereby be able to obtain a better curve matching between $V_{comp}$ and the drift characteristic. More particularly if one of the exponential terms is altered then it is necessary to apply an equal alteration to the linear term if it is desired to obtain an asymmetrical alteration or correction.

Referring to FIG. 3, the circuit 30 comprises a transducer 36 for deriving a voltage indicative of the temperature difference $(T-T_R)$. This voltage is supplied to two signal paths. A first of these signal paths includes a multiplier 38 in which $(T-T_R)$ is multiplied by the constant c and the product is applied to an inverting input of a summing amplifier 40.

The other of the signal paths includes a circuit 42 for compensating for the effects of temperature on exponential amplifiers 44, 46. As the amplifier 46 is of similar construction to the amplifier 44, its component parts have been referenced with primed numerals. Ignoring the circuit 42 for the moment, the voltage indicative of the temperature difference is applied respectively to multipliers 48, 50. In the multiplier 48 this voltage is multiplied by the constant a1 and the product is applied to the exponential amplifier 44. The amplifier 44 comprises an operational amplifier 52 having a diode 54 forwardly biased with a fixed current which is temperature independent in its feedback path. The output of the operational amplifier 52 is connected by way of a diode 56 to the inverting input of the summing amplifier 40. The diode 56 generates the exponential function.

In the multiplier 50, the voltage is multiplied by the constant a2 and the product is applied to the exponential amplifier 46 which is of a similar type to the amplifier 44 except that the diodes 54', 56' are oppositely poled relative to the diodes 54, 56.

The output of the summing amplifier 40 comprises the compensating voltage $V_{comp}$ which is applied to the varactor diode 28 (FIG. 1) via a resistor 41.

Reverting to the circuit 42, the voltage represented by $(T-T_R)$ is applied by way of a resistor 58 to an operational amplifier 60 having a feedback circuit formed by a transconductor 62 constructed as a differential transistor pair and a current mirror. In operation the tail current $I_{const}$ is set to a fixed and temperature independent value so that the transconductor will be $g_m = \frac{1}{2}q \cdot I_{const}/kT$ where:

q is the charge of an electron k is Boltzmans constant

T is the absolute temperature (degrees K.) with this temperature dependency in the feedback circuitry the gain of the amplifier 60 will be proportional to the absolute temperature, that is the output voltage $$V = \frac{T}{T_R} \times V_{in},$$

where Vin is the voltage presented by $(T-T_R)$.

If desired the transconductor may comprise more than one differential pair and more than one current mirror.

Figure 5:
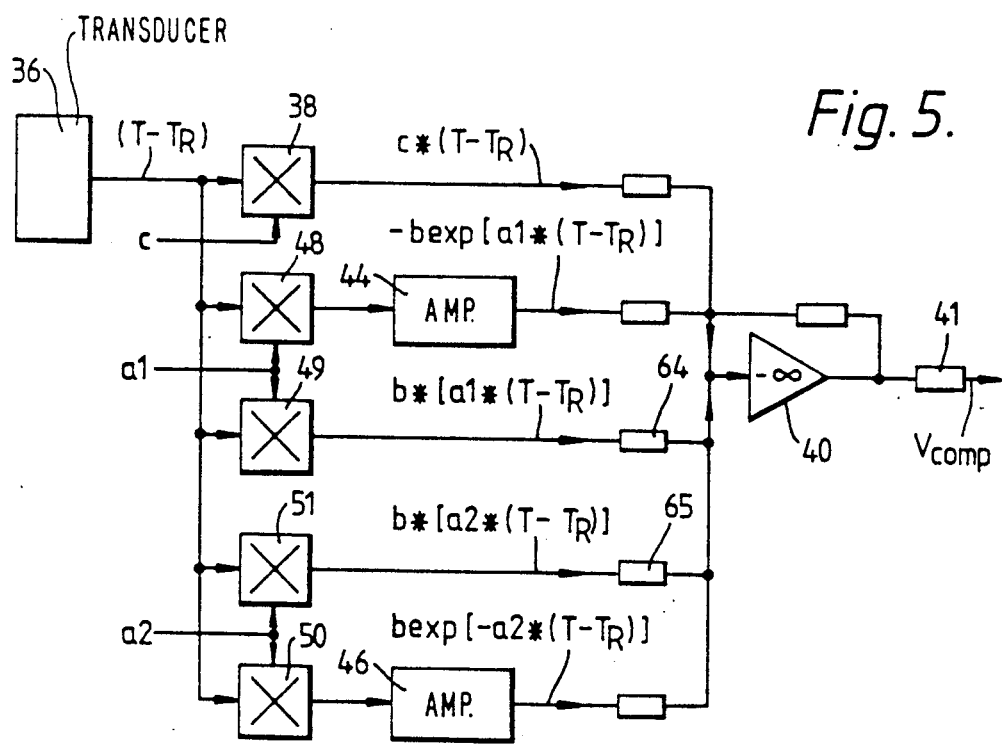
FIG. 5 is a block schematic circuit diagram of a modified temperature compensating voltage generating circuit which is able to effect asymmetrical alterations to the temperature compensating characteristic.

FIG. 5 illustrates a modification of the circuit shown in FIG. 3 whereby, by variation of the constant a1 and a2, the exponential characteristic can be adjusted while the gradient of the curve at $T_R$ remains constant, as defined by constant c. This feature facilitates the calibration procedure. In FIG. 5, a linear correction term is produced corresponding to the exponential term by providing a multiplier 49 in which the voltage representing $(T-T_R)$ is multiplied by the constant a1. The linear term formed, that is, $b*[a1*(T-T_R)]$, is applied to the summing amplifier 40 by way of a resistor 64.

In the case of the inverse exponential term, a linear correction term is produced by multiplying the voltage representing $(T-T_R)$ by the constant a2 in a multiplier 51 and applying the output to the summing amplifier 40 by way of a resistor 65 which determines the constant b.

The circuit 42 (FIG. 3) may be connected in the signal path to the multipliers 48 to 51.

From reading the present disclosure, other modifications will be apparent to persons skilled in the art. Such modifications may involve other features which are already known in the design, manufacture and use of temperature controlled crystal oscillators and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of temperature controlling a crystal oscillator circuit including a crystal and a frequency pulling element, the method comprising generating a compensating voltage in accordance with a function formed by a linear term, an exponential term and an inverse exponential term, and applying the compensating voltage to the frequency pulling element.

2. A method as claimed in claim 1, in which the function is:

$$V_{comp}=b*\exp[a1*(T-T_R)]b*\exp[-a2*(T-T_R)]+c*(T-T_R)$$

where:

$V_{comp}$ is the compensating voltage;
$T_R$ is a reference temperature in degrees Kelvin;
T is the working temperature in degrees Kelvin;
a1, a2, b and c are constants.

3. A method as claimed in claim 2, including compensating for the effects of temperature variation on means for generating the exponential and inverse exponential terms.

4. A temperature controlled crystal oscillator circuit comprising an amplifying element having a feedback path including a crystal and a frequency pulling element, and temperature compensating voltage generating means coupled to the frequency pulling element, said compensating voltage generating means applying a voltage in accordance with a function formed by a linear term, an exponential term and an inverse exponential term.

5. A circuit as claimed in claim 4, in which the function is:

$$V_{comp}=b*\exp[a1*(T-T_R)]+b*\exp[-a2*(T-T_R)]+c*(T-,T_R)$$

where:

$V_{comp}$ is the compensating voltage;
$T_R$ is a reference temperature in degrees Kelvin;
T is the working temperture in degrees Kelvin;
a1, a2, b and c are constants.

6. A circuit as claimed in claim 5, in which the means for producing the exponential and inverse exponential terms include respective exponential and inverse exponential amplifiers, and the temperature compensating voltage generating means further comprises means for compensating for the temperature effects on the exponential and inverse exponential amplifiers.

7. A circuit as claimed in claim 6, in which said means for compensating for the temperature effect on the exponential and inverse exponential amplifiers comprises an operational amplifier connected in a signal path from a device for producing a voltage indicative of $(T-T_R)$ to said exponential and inverse exponential amplifiers, and a transconductor connected in a feedback path of the operational amplifier.

8. A circuit as claimed in claim 7, in which the transconductor comprises one or more differential pairs and current mirrors, and in that the tail current is set to a fixed and temperature independent value.

9. A circuit as claimed in claim 8, including a first and second multiplier for multiplying the voltage representing $(T-T_R)$ by the constant a1, the output of the first multiplier being connected to the exponential amplifier and the output of the second multiplier being coupled to summing means for forming the function $V_{comp}$, and third and fourth multipliers for multiplying a voltage representing $(T-T_R)$ by the constant a2, the output of the third multiplier being connected to the inverse exponential amplifier and the output of the fourth multiplier being coupled to said summing means.

10. A radio communications apparatus including the temperature controlled crystal oscillator circuit as claimed in claim 4.

11. A circuit as claimed in claim 7, including a first and second multiplier for multiplying the voltage representing $(T-T_R)$ by the constant a1, the output of the first multiplier being connected to the exponential amplifier and the output of the second multiplier being coupled to summing means for forming the function $V_{comp}$, and third and fourth multipliers for multiplying a voltage representing $(T-T_R)$ by the constant a2, the output of the third multiplier being connected to the inverse exponential amplifier and the output of the fourth multiplier being coupled to said summing means.

12. A circuit as claimed in claim 6, including a first and second multiplier for multiplying the voltage representing (T–$T_R$) by the constant a1, the output of the first multiplier being connected to the exponential amplifier and the output of the second multiplier being coupled to summing means for forming the function $V_{comp}$, and third and fourth multipliers for multiplying a voltage representing (T–$T_R$) by the constant a2, the output of the third multiplier being connected to the inverse exponential amplifier and the output of the fourth multiplier being coupled to said summing means.

13. A circuit as claimed in claim 4, in which the means for producing the exponential and inverse exponential terms include respective exponential and inverse exponential amplifiers, and the temperature compensating voltage generating means further comprises means for compensating for the temperture effects on the exponential and inverse exponential amplifiers.

14. A method as claimed in claim 1, including compensating for the effects of temperature variation on means for generating the exponential and inverse exponential terms.

* * * * *